(12) United States Patent
Kim

(10) Patent No.: US 7,982,283 B2
(45) Date of Patent: Jul. 19, 2011

(54) SEMICONDUCTOR DEVICE AND METHOD FOR MANUFACTURING THE SAME

(75) Inventor: Wan-Shick Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 274 days.

(21) Appl. No.: 12/198,505

(22) Filed: Aug. 26, 2008

(65) Prior Publication Data

US 2009/0065892 A1    Mar. 12, 2009

(30) Foreign Application Priority Data

Sep. 7, 2007    (KR) .................. 10-2007-0090831

(51) Int. Cl.
*H01L 21/762*    (2006.01)
(52) U.S. Cl. .. 257/510; 257/513; 257/514; 257/E23.002
(58) Field of Classification Search .............. 257/510, 257/E23.002, E21.546, 513, 514
See application file for complete search history.

(56) References Cited

U.S. PATENT DOCUMENTS

| 5,970,238 | A  | * | 10/1999 | Shibata et al. ................. 716/55 |
| 6,495,855 | B1 | * | 12/2002 | Sawamura ..................... 257/48 |
| 6,855,605 | B2 | * | 2/2005  | Jurczak et al. ............... 438/275 |
| 2002/0168833 | A1 | * | 11/2002 | Ota et al. ..................... 438/427 |
| 2003/0203619 | A1 |   | 10/2003 | Abe |
| 2005/0026341 | A1 |   | 2/2005  | Nuetzel |

FOREIGN PATENT DOCUMENTS

| CN | 1499626 | 5/2004 |
| DE | 10 2004 034 820 A | 3/2005 |

* cited by examiner

*Primary Examiner* — Thinh T Nguyen
(74) *Attorney, Agent, or Firm* — Sherr & Vaughn, PLLC

(57) ABSTRACT

A semiconductor device and a method for manufacturing the same that reduces a process defect caused by pattern dependency in chemical mechanical polarization (CMP) or etching is excellent. The semiconductor device includes a device pattern formed on or in a substrate; and a plurality of dummy patterns having different longitudinal-sectional areas formed at one side of the device pattern. The dummy patterns, which have the same planar size but have different longitudinal-sectional areas from the three-dimensional structural point of view, include first dummy pattern having a first thickness and second dummy pattern having a second thickness larger than the first thickness.

5 Claims, 2 Drawing Sheets

SEMICONDUCTOR DEVICE AND METHOD FOR MANUFACTURING THE SAME

The present application claims priority under 35 U.S.C. §119 to Korean Patent Application No. 10-2007-0090831 (filed on Sep. 7, 2007), which is hereby incorporated by reference in its entirety.

BACKGROUND

A semiconductor device may have a multilayered structure by which each respective layer is formed by sputtering or chemical vapor deposition and then patterned by lithography. Various problems are generated due to a difference of sizes and densities of a pattern on and/or over a substrate of a semiconductor device, and thus, a technology of forming dummy patterns together with a main pattern has been developed.

SUMMARY

Embodiments relate to a semiconductor device and a method for manufacturing the semiconductor device having a plurality of dummy patterns effectively reducing a process defect caused by pattern dependency in chemical mechanical polarization (CMP) or etching.

Embodiments relate to a semiconductor device that may include at least one of the following: a device pattern formed on and/or over a substrate; and a plurality of dummy patterns having different longitudinal-sectional areas formed at one side of the device pattern.

Embodiments relate to a method for manufacturing a semiconductor device that may include at least one of the following steps: forming a device pattern on and/or over a substrate; and then forming a plurality of dummy patterns having different longitudinal-sectional areas at one side of the device pattern.

Embodiments relate to method that may include at least one of the following steps: forming a shallow trench isolation pattern in a substrate; and then forming first trenches in the substrate at a first depth at one side of the shallow trench isolation pattern by performing a first etching process on the substrate; and then forming second trenches in the substrate at a second depth larger than the first depth by performing a second etching process on some of the first trenches; and then forming a first dummy pattern having a first thickness by filling the first trenches; and then forming a second dummy pattern at a second thickness larger than the first thickness by filling the second trenches.

DRAWINGS

Figure 1:
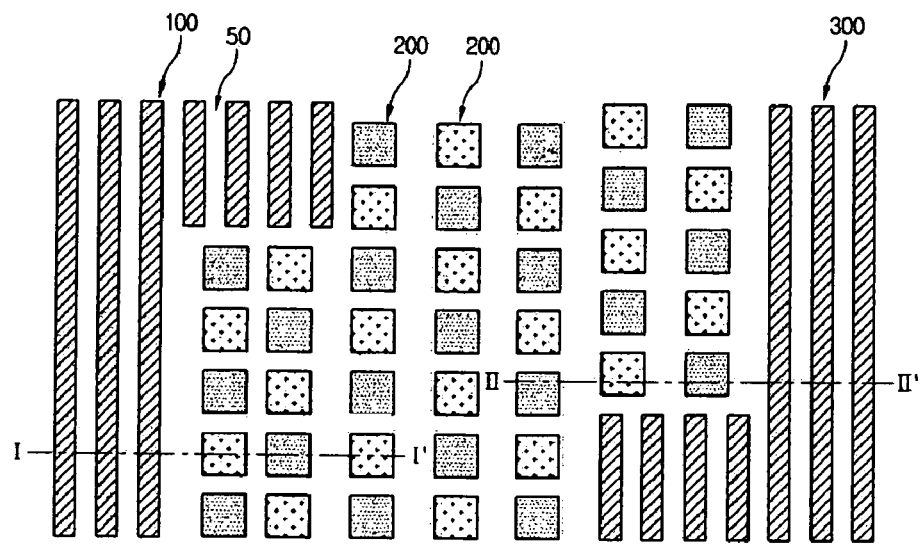
Figure 2:
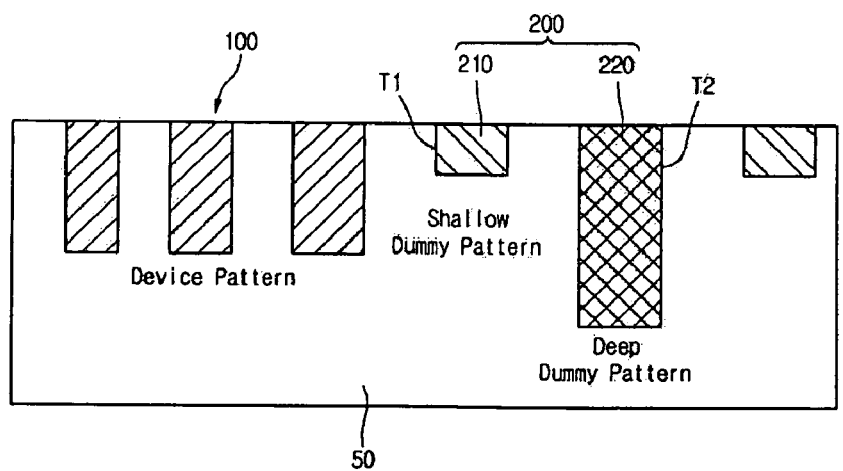
Figure 3:
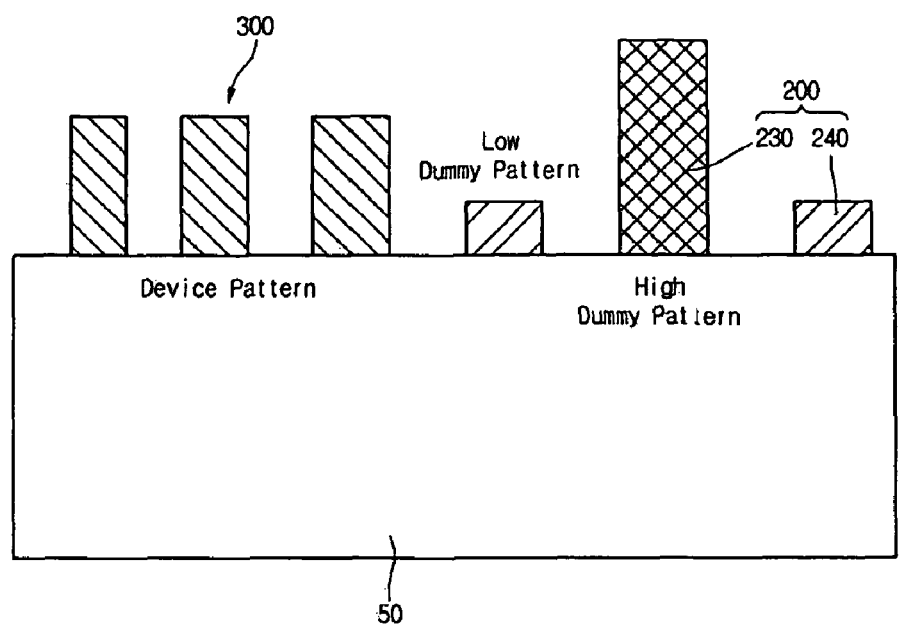

Example FIGS. 1 to 3 illustrates a method for manufacturing a semiconductor device and a semiconductor device in accordance with embodiments.

DESCRIPTION

It will be understood that when an element such as a layer, region or substrate is referred to as being "on/under" another element, it can be directly on/under the other element or intervening elements may also be present.

As illustrated in example FIG. 1, the semiconductor device in accordance with embodiments may include device patterns 100 and dummy patterns 200. Device patterns 100 are formed on and/or over substrate 50 and a plurality of dummy patterns 200 having different longitudinal-sectional areas is formed at one side of device patterns 100. Dummy patterns 200 may have the same planar size, as illustrated in example FIGS. 1 and 2, or have different planar sizes. Accordingly, in the semiconductor device in accordance with embodiments, although the dummy patterns have the same planar size, the dummy patterns have different longitudinal-sectional areas from a three-dimensional structural point of view. Thus, an effect of enhancing a process defect caused by pattern dependency in chemical mechanical polarization (CMP) or etching is reduced.

In accordance with embodiments, device pattern 100, serving as a main pattern, may have a shallow trench isolation (STI) pattern. The STI pattern is formed in substrate 50 by any isolation method. Dummy patterns 200 include first dummy pattern 210 formed at one side of device pattern 100 at a first thickness, and second dummy pattern 220 formed at a second thickness larger than the first thickness. In accordance with embodiments, in the formation of dummy patterns 200, a plurality of first trenches (T1) having a first depth is formed in substrate 50 at one side of device pattern 100. Then, second trenches (T2) having the second depth deeper than the first depth are formed in substrate 50. As described hereinabove, first trenches (T1) and second trenches (T2) are separately formed. Alternatively, a plurality of first trenches (T1) having the first depth are formed in substrate 50 at one side of device pattern 100 and then second trenches (T2) having the second depth are formed by additionally etching some first trenches (T1).

The above process of separately forming first trenches (T1) and second trenches (T2) and the above process of forming second trenches (T2) by performing a second etching process on some first trenches (T1) may be performed by photolithography and etching using a photosensitive film, and a detailed description thereof will be thus omitted.

Thereafter, first trenches (T1) and second trenches (T2) are filled to thereby form first dummy pattern 210 at the first thickness and second dummy pattern 220 at the second thickness. In order to exhibit an effect of using at least two kinds of dummy patterns although dummy patterns 200 having one planar size are used, dummy patterns 200 are formed to have different longitudinal-sectional areas from a three-dimensional structural point of view. Meaning, in case that device pattern 100 is a STI pattern, as illustrated in example FIG. 2, first trenches (T1) having a shallow depth are formed and second trenches (T2) having a deeper depth are mutually formed in a lattice shape to form dummy patterns. Thus, the surface profiles of a gap fill oxide filling trenches T1 and T2 can be adjusted. Therefore, entirely regular and repetitive dummy patterns 210 and 220 are formed. Thereby, it is possible to remove pattern dependency in chemical mechanical polarization (CMP) or trench etching.

As illustrated in example FIG. 3, in accordance with embodiments, as opposed to embodiments illustrated in example FIG. 2, in which the device pattern is a STI pattern, device pattern 300 may be a poly pattern, but is not limited thereto. For example, device pattern 300 may be a metal pattern. The poly pattern or the metal pattern is formed by a general process. That is, a poly layer or a metal layer is formed on and/or over substrate 50 by deposition, and is then patterned, thus producing device pattern 300, i.e., the poly pattern or the metal pattern. Dummy patterns 200 include third dummy pattern 230 formed at one side of device pattern 300 at a third height relative to the uppermost surface of substrate 50 and fourth dummy pattern 240 formed at a fourth height lower than the third height.

In accordance with embodiments, in the formation of dummy patterns 200, third dummy pattern 230 having the third height is formed on and/or over substrate 50 at one side of device pattern 300. Then, fourth dummy pattern 240 having the fourth height lower than the third height is formed on and/or over substrate 50. As described above, third dummy pattern 230 and fourth dummy pattern 240 are separately formed.

Alternatively, in the formation of dummy patterns 200, a plurality of third dummy patterns 230 having the third height are formed on and/or over substrate 50 at one side of device pattern 300. Then, fourth dummy pattern 240 having the fourth height lower than the third height is formed on and/or over substrate 50 by additionally etching some third dummy patterns 230. For example, a material layer for third and fourth dummy patterns 230 and 240 is formed on and/or over substrate 50 by deposition, and then third and fourth dummy patterns 230 and 240 are formed by etching using a general mask. In accordance with embodiments, the dummy patterns illustrated in example FIGS. 1 and 3 may have the same planar size or different planar sizes.

In order to exhibit an effect of using at least two kinds of dummy patterns although dummy patterns having one size are used, the dummy patterns in accordance with embodiments are formed to have different longitudinal-sectional areas from a three-dimensional structural point of view. In a case in which device pattern 300 is a metal pattern or a poly pattern, as illustrated in example FIG. 3, some patterns 230 of dummy patterns 200 are formed to a large height, and the remainder 240 of dummy patterns 200 are formed to a small height. Thus, the surface profiles of an inter metal dielectric (IMD) deposited on and/or over the uppermost surfaces of dummy patterns 230 and 240 can be adjusted. Therefore, entirely regular and repetitive dummy patterns 230 and 240 are formed. Thereby, it is possible to remove pattern dependency in subsequent chemical mechanical polarization (CMP) of the IMD.

In the semiconductor device and the method for manufacturing the same in accordance with embodiments, although dummy patterns having the same planar size are used, the dummy patterns have different longitudinal-sectional areas from the three-dimensional structural point of view, and thus an effect of reducing a process defect caused by pattern dependency in chemical mechanical polarization (CMP) or etching is excellent.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
    a device pattern formed adjacent to a substrate; and
    a plurality of dummy patterns having different longitudinal-sectional areas formed at one side of the device pattern,
    wherein the device pattern comprises a shallow trench isolation pattern formed in the substrate and the plurality of dummy patterns comprises a first dummy pattern formed at one side of the device pattern at a first thickness and a second dummy pattern formed at a second thickness larger than the first thickness,
    wherein the first dummy pattern and the second dummy pattern are mutually formed in a lattice shape,
    wherein a surface profiles of a gap fill on the plurality of dummy patterns is adjusted according to the different depth of the plurality of dummy patterns.

2. The semiconductor device of claim 1, wherein the device pattern comprises a poly pattern formed on the substrate and the plurality of dummy patterns comprises a first dummy pattern formed at one side of the device pattern to a first height relative to the uppermost surface of the substrate and a second dummy pattern formed to a second height less than the first height.

3. The semiconductor device of claim 1, wherein the device pattern comprises a metal pattern formed on the substrate and the plurality of dummy patterns comprises a first dummy pattern formed at one side of the device pattern to a first height relative to the uppermost surface of the substrate and a second dummy pattern formed to a second height less than the first height.

4. The semiconductor device of claim 1, wherein the plurality of dummy patterns have the same planar size.

5. The semiconductor device of claim 1, wherein the plurality of dummy patterns have different planar sizes.

\* \* \* \* \*